United States Patent
Muffler

(10) Patent No.: US 10,130,971 B2
(45) Date of Patent: Nov. 20, 2018

(54) SUBSTRATE PLATE

(71) Applicant: solar-semi GmbH, Radolfzell (DE)

(72) Inventor: Pirmin Muffler, Orsingen-Nenzingen (DE)

(73) Assignee: solar-semi GmbH, Radolfzell (DE)

( * ) Notice: Subject to any disclaimer, the term of this patent is extended or adjusted under 35 U.S.C. 154(b) by 0 days.

(21) Appl. No.: 13/733,242

(22) Filed: Jan. 3, 2013

(65) Prior Publication Data

US 2013/0189439 A1 Jul. 25, 2013

(30) Foreign Application Priority Data

Jan. 3, 2012 (DE) .................. 10 2012 100 030

(51) Int. Cl.
*B05C 13/00* (2006.01)
*H01L 21/683* (2006.01)
*H01L 21/687* (2006.01)

(52) U.S. Cl.
CPC .......... *B05C 13/00* (2013.01); *H01L 21/6838* (2013.01); *H01L 21/6875* (2013.01)

(58) Field of Classification Search
CPC ...................................................... B05C 13/00
See application file for complete search history.

(56) References Cited

U.S. PATENT DOCUMENTS

| | | | | |
|---|---|---|---|---|
| 4,280,689 A | * | 7/1981 | Lombardi | ........................ 269/21 |
| 5,230,741 A | * | 7/1993 | van de Ven | ............. C23C 16/04 118/720 |
| 5,249,785 A | * | 10/1993 | Nelson et al. | .................... 269/21 |
| 6,590,633 B1 | * | 7/2003 | Nishi et al. | ...................... 355/53 |
| 2002/0094260 A1 | | 7/2002 | Coomer et al. | |
| 2009/0277379 A1 | | 11/2009 | Ohmi et al. | |

FOREIGN PATENT DOCUMENTS

| | | |
|---|---|---|
| EP | 053278 A2 | 6/1982 |
| EP | 0456426 A1 | 11/1991 |
| WO | 2005103825 A2 | 11/2005 |

OTHER PUBLICATIONS

Polytechnical Dictionary, Sovetskaya entsiklopedia, 1977, p. 249).
Translation of Russian Office Action, Application No. 2012155091/02(087369), dated Dec. 22, 2016.

* cited by examiner

*Primary Examiner* — Dah-Wei D. Yuan
*Assistant Examiner* — Stephen A Kitt
(74) *Attorney, Agent, or Firm* — Fishman Stewart PLLC

(57) ABSTRACT

A device for lacquering or coating a substrate is disclosed. The device includes a substrate plate configured to accommodate said substrate, and one or more suction points connected to, and extending upwardly from, the substrate plate. The one or more suction points may be configured to provide a vacuum to said substrate.

17 Claims, 2 Drawing Sheets

SUBSTRATE PLATE

CROSS-REFERENCE TO RELATED APPLICATIONS

This application claims the benefit of priority to German Application No. 102012100030.1, filed Jan. 3, 2012, which is fully incorporated herein by reference as though fully set forth herein.

TECHNICAL FIELD

The present disclosure concerns a substrate plate for holding a substrate that may be lacquered or coated.

BACKGROUND

Devices having a rotary plate and a substrate plate are used for processing, especially lacquering and/or coating of substrates. A drive is arranged beneath the rotary plate, which rotates the rotary plate and also the substrate plate via a rotational shaft.

EP 1 743 220 B1, for example, discloses such a device. However, it is not disclosed here how the substrate is held on the substrate plate.

Known holding methods have the drawback that they can damage an already lacquered and/or coated surface of the substrate. This is a particular disadvantage in substrates that are to be lacquered and/or coated on both sides. It is a shortcoming that a downward directed substrate surface, which is still to be lacquered and/or coated in a later work step, can already be sprayed during lacquering and/or coating of the other side.

BRIEF SUMMARY

The task of the invention is to provide a substrate plate, which minimizes the drawbacks just mentioned or even eliminates them and the bottom of the substrate surface being lacquered is kept as pristine as possible.

The features of the disclosure lead to solution of the aforementioned challenges.

In typical practical examples a substrate plate includes a suction point to accommodate a substrate on its surface. This provides the advantage that the substrate is attached by suction via the suction point and can be reliably held on the substrate plate on this account. Even during rotation, acceleration and braking of the substrate plate there is no hazard that the substrate will fall down. Owing to the fact that the holding force is exerted by a suction point, the advantage is gained that a hazard of damage by holding elements, grippers, clamps or the like is at least minimized.

In typical practical examples the suction plate has a spacing from a surface of the substrate plate. This provides the advantage that the substrate plate only comes in contact with the suction point so that only few contact surfaces that might lead to damage are produced.

The suction point preferably has a spacing from 1 mm to 30 mm, with particular preference 7 mm from a surface of the substrate plate. This provides the advantage that a sufficient spacing is achieved, but a tube forming the suction point still has sufficient stability.

In typical practical examples the substrate plate includes a number of suction points. This provides the advantage that the substrate plate is held reliably in one plane and cannot tilt. Moreover there is the advantage that only a limited holding force is required on each individual suction point because of the number of suction points. It is therefore sufficient if only a slight partial vacuum is applied to substrate plate or suction points.

In typical practical examples the substrate plate includes three, four or five suction points. This is particularly advantageous because the substrate plate is reliably held by this and long lines are not produced.

In typical practical examples the suction point is connected to a partial vacuum source by a channel. This provides the advantage that a partial vacuum can be applied to the suction points, producing the holding force.

In typical practical examples the channels are arranged in the substrate plate. The channels are preferably arranged in one plate of the substrate plate. This provides the advantage that no additional lines or tubes must be laid. This is particularly advantageous since the substrate plate is rotated with high speed.

In typical practical examples the channel is milled into one surface of the substrate plate or into one plate of the substrate plate. This provides the advantage that the channel or channels can be produced very simply.

In typical practical examples a closure piece is inserted into the recess in order to seal off the channel. In this way the channel remains free. This is particularly advantageous because production of the channel is greatly simplified on this account and drilling of long holes is not necessary.

In typical practical examples the suction point includes a flexible surface. This provides the advantage the suction point has not sharp edges at the locations that come in contact with the substrate which could lead to damage to the substrate. The suction point preferably includes a rubber lip that forms the flexible surface.

Protection is separately claimed for use of a substrate plate in an apparatus for rotational lacquering of substrates. This provides the advantage that the substrate can be reliably held in an apparatus for rotational lacquering and/or coating. The substrate is also held in a manner that protects the back side by the design of the substrate points.

In typical practical examples an inner area of the device is sealed off from the atmosphere for rotational lacquering. This provides the advantage that a co-rotating air column is formed between the substrate and the substrate plate and the effect is intensified. This prevents lacquer or coating medium from reaching the back of the substrate, which is only to be lacquered and/or coated later.

BRIEF DESCRIPTION OF THE DRAWINGS

The invention is briefly described below with reference to the accompanying drawing, in which its individual figures show.

DETAILED DESCRIPTION

Figure 1:
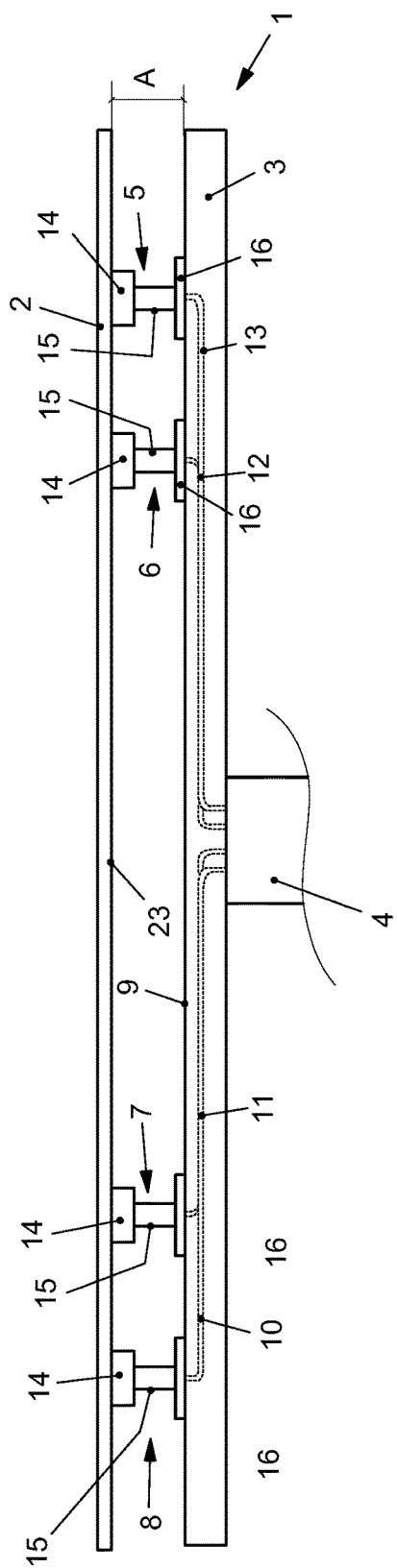
FIG. 1—a schematic depiction of a side view of substrate plate according to the invention with a substrate.

FIG. 1 shows a substrate plate 1 according to the invention with a substrate 2. The substrate plate 1 includes a plate 3, a connection site 4 and a four suction points 5, 6, 7 and 8.

The substrate 2 and plate 3 in the present practical example are designed as circular disks.

In additional practical examples (not depicted) plates with rectangular, square or triangular shape are used. In principle, all plate shapes for all substrate shapes are suitable. Only the arrangement of the suction points is important.

Each of the section points 5, 6, 7 and 8 has a spacing A from the surface 9 of plate 3. This provides the advantage that the substrate 2 forms only a few support points with the substrate plate 1. Because of this the number of contact sites that might lead to damage of the surface or the coating is reduced.

Each of the suction points 5, 6, 7 and 8 is connected via a channel 10, 11, 12 and 13 to a compressed air source (not shown). The compressed air source is preferably connected to channels 10, 11, 12 and 13 and a connection site 4.

The suction points 5, 6, 7 and 8 each have a tube 15. The length of the tube 15 determines the spacing A of the section points 5, 6, 7 and 8 and the substrate 2 from a surface 9 of plate 3.

Figure 2:
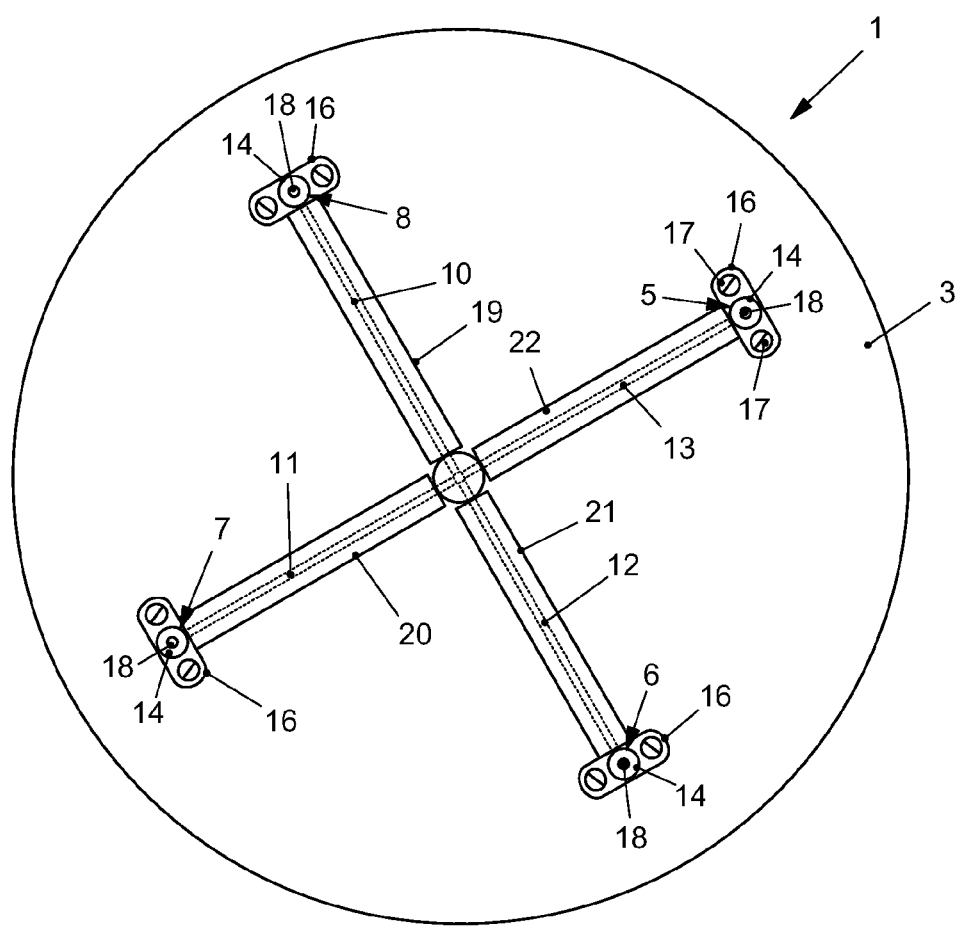
FIG. 2—a schematic depiction of a top view of a substrate plate according to the invention.

Tube 15 includes a foot 16. The tube 15 is fastened to the plate 3 with foot 16. As is apparent in FIG. 2, the foot 16 is preferably screwed onto plate 3 with screws 17.

Each of the suction points 5, 6, 7 and 8 has a flexible surface. In the present practical example the flexible surface is formed by rubber lip 14. The rubber lip 14 is stretched onto an upper edge of the tube 15 so that an opening 18 remains free.

The channels 10, 11, 12 and 13 of a surface 9 of plate 3 are preferably milled in plate 3. As is apparent in FIG. 2, the channels 10, 11, 12 and 13 are each closed by a closure piece 19, 20, 21 and 22. This provides the advantage that the channels can be produced simply.

The invention functions as follows:

The substrate plate 1 is preferably used in apparatuses for rotary lacquering of substrates. For this purpose the substrate plate 1 is connected to a partial vacuum source.

The substrate 2 is then placed on the suction points 5, 6, 7 and 8. Substrate 2 is reliably held even during rotation by the applied partial vacuum. Because of the limited number and small size of the suction points 5, 6, 7 and 8 it is prevented that any already coated back side 23 is damaged. This is particularly advantage in a substrate 2 that is to be coated on both sides.

By using the substrate plate 1 according to the invention in an apparatus for lacquering that is sealed relative to the atmosphere, the advantage is obtained that in the area between substrate 2 and plate 3 a co-rotating air column is formed. This prevents from lacquer or coating material from penetrating into the area between plate 3 and substrate 2. Sprays onto the back of substrate 2 are avoided on this account.

After lacquering and/or coating of a surface of substrate 2 that the partial vacuum source is switched off so that substrate 2 can be removed from substrate plate 1 with a handling unit. The substrate 2 is then rotated so that the back side 23 depicted in FIG. 1 faces up and is placed on the suction points 5, 6, 7 and 8.

The partial vacuum source is now switched on again so that the substrate 2 is again reliably held on the suction points 5, 6, 7 and 8.

The substrate plate 1 is rotated to coat and/or lacquer the back side 23 of substrate 1 now on the top. As already described, this is very sparing for the already coated top now lying on the bottom. On the one hand, few contacts sites are present that could damage the coating. On the other hand, the co-rotating air column prevents sprays from reaching the already coated side of the substrate facing plate 3 now lying on the bottom during the second coating and/or lacquering process.

The invention claimed is:

1. A device for lacquering or coating a substrate, the device comprising:
   a substrate plate configured to accommodate said substrate, the substrate plate configured for rotational movement;
   a plurality of suction points connected to, and extending upwardly from, the substrate plate, wherein the suction point is configured to provide a vacuum to said substrate, the plurality of suctions points including four suction points;
   at least one upwardly terminating channel disposed and milled in a top surface of the substrate plate, the channel being connected to the suction point; and
   a closure piece provided on the substrate plate for closing or sealing off at least one upwardly terminating channel;
   wherein each suction point includes a respective tube extending upwardly from a top surface of the substrate plate; each tube provides spacing between a surface of said substrate and the substrate plate; the plurality of suction points each include a flexible surface; each respective tube has a foot defining an end of the tube via which each respective suction point is fastened to the substrate plate; a length of the respective tube determines a spacing of said substrate from a surface of the substrate plate; and each respective suction point is connected to a partial vacuum source via a respective milled channel in the substrate plate.

2. The device according to claim 1, wherein the plurality of suction points are configured to hold a substrate in a plane that is substantially parallel to the substrate plate.

3. The device according to claim 1, the suction points are configured to be the only components that contact said substrate.

4. The device according to claim 1, wherein a width of each closure piece is greater than a width of the at least one upwardly terminating channel.

5. The device according to claim 1, wherein the flexible surface comprises a rubber lip.

6. The device according to claim 1, wherein each foot is screwed into the substrate plate via at least one screw.

7. The device according to claim 1, wherein an inner area of the device between the substrate plate and said substrate is configured to be sealed off from the atmosphere.

8. The device according to claim 1, wherein the substrate plate is substantially circular.

9. The device according to claim 8, wherein respective tubes are connected to each of the suction points and central axes of the respective tubes are generally provided in connection with the substrate plate at least at 12 o'clock, 3 o'clock, 6 o'clock, and 9 o'clock positions.

10. The device according to claim 1, wherein the at least one upwardly terminating channel includes at least four upwardly terminating channels, each upwardly terminating channel extending radially outward from a center of the substrate plate, and wherein each of the suction points is disposed at an outer radial end of a respective one of the upwardly terminating channels.

11. The device according to claim 1, wherein the spacing of said substrate from the surface of the substrate plate is determined by a length of the tube or tubes in addition to a length of the foot or feet and a length of the plurality of suction points.

12. The device according to claim 1, wherein each tube is disposed entirely above the substrate plate.

13. A device for lacquering or coating a substrate, the device comprising:

a substrate plate configured to accommodate said substrate, the substrate plate configured for rotational movement;

a plurality of suction points connected to, and extending upwardly from, the substrate plate for providing a vacuum to said substrate and the only contact points for said substrate, wherein each suction point includes a tube extending upwardly from a surface of the substrate plate to provide spacing between said substrate and the substrate plate, and each suction point also includes a flexible surface configured for contact with said substrate;

a plurality of upwardly terminating channels disposed and milled in a top surface of the substrate plate, the plurality of channels connecting the suction points, respectively, to at least a partial vacuum source; and a plurality of discrete closure pieces inserted into respective upwardly terminating channels of the plurality of upwardly terminating channels for closing or sealing off the plurality of upwardly terminating channels, respectively;

wherein each tube has a foot defining an end of the tube via which each respective suction point is fastened to the substrate plate; and each tube is disposed entirely above the substrate plate; and the length of each tube determines a spacing of said substrate from a surface of the substrate plate.

14. The device according to claim 13, wherein each of the plurality of upwardly terminating channels extends in a respective radial direction from a center of the substrate plate.

15. The device according to claim 14, wherein each of the plurality of upwardly terminating channels is disposed perpendicularly to two other upwardly terminating channels.

16. The device according to claim 13, wherein each of the plurality of suction points is fixed at an outer radial end of a respective one of the plurality of upwardly terminating channels.

17. The device according to claim 13, wherein the plurality of discrete closure pieces includes four closure pieces of a first configuration and a fifth closure piece of a second configuration.

* * * * *